US012660491B2

(12) United States Patent
Khayrullin et al.

(10) Patent No.: US 12,660,491 B2
(45) Date of Patent: Jun. 16, 2026

(54) SYSTEM AND METHOD FOR DIRECT PATTERNING USING A COMPENSATED SHADOW MASK

(71) Applicant: eMagin Corporation, Hopewell Junction, NY (US)

(72) Inventors: Ilyas I. Khayrullin, Hopewell Junction, NY (US); Howard Lin, Hopewell Junction, NY (US); Fangchao Zhao, Hopewell Junction, NY (US); Timothy Considine, Hopewell Junction, NY (US); Laurie Sziklas, Hopewell Junction, NY (US); Kerry Tice, Hopewell Junction, NY (US); Amalkumar P. Ghosh, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 364 days.

(21) Appl. No.: 18/241,730

(22) Filed: Sep. 1, 2023

(65) Prior Publication Data

US 2024/0081136 A1     Mar. 7, 2024

Related U.S. Application Data

(60) Provisional application No. 63/404,076, filed on Sep. 6, 2022.

(51) Int. Cl.
*H10K 71/16* (2023.01)
*C23C 14/04* (2006.01)
(Continued)

(52) U.S. Cl.
CPC ......... *H10K 71/166* (2023.02); *C23C 14/042* (2013.01); *C23C 14/24* (2013.01); *C23C 14/50* (2013.01); *H10K 59/10* (2023.02)

(58) Field of Classification Search
CPC .... H10K 71/166; H10K 59/10; C23C 14/042; C23C 14/24; C23C 14/50
See application file for complete search history.

(56) References Cited

U.S. PATENT DOCUMENTS 8,882,918 B2     11/2014  Kawato et al.
8,906,445 B2     12/2014  Kim et al.
(Continued)

OTHER PUBLICATIONS

International Search Report and Written Opinion issued in PCT Patent Application No. PCT/US2023/031981 on Jan. 3, 2024.

*Primary Examiner* — Richard A Booth
(74) *Attorney, Agent, or Firm* — Kaplan Breyer Schwarz, LLP

(57) ABSTRACT

Systems and methods for performing direct patterning of a material on a substrate with high fidelity to a desired pattern are presented. A pattern of apertures of a shadow mask is compensated to accommodate a range of propagation angles in a vapor plume used to deposit material onto the substrate through the shadow mask. A shadow mask in accordance with the present disclosure includes an aperture pattern in which aperture position is shifted inward toward the center of the shadow mask by an amount based on the distance of the aperture from the center of the shadow mask. As a result, vaporized material passing through an aperture at a non-normal angle deposits onto the substrate at its proper desired location.

12 Claims, 11 Drawing Sheets

(51) Int. Cl.
  *C23C 14/24* (2006.01)
  *C23C 14/50* (2006.01)
  *H10K 59/10* (2023.01)

(56) References Cited

U.S. PATENT DOCUMENTS

| | | | |
|---|---|---|---|
| 2013/0251907 A1* | 9/2013 | Pan | C23C 14/568 |
| | | | 427/282 |
| 2014/0342102 A1* | 11/2014 | Ambrose | C23C 16/042 |
| | | | 118/721 |
| 2017/0342542 A1* | 11/2017 | Ghosh | C23C 14/042 |
| 2018/0209039 A1 | 7/2018 | Ochi et al. | |
| 2018/0340252 A1 | 11/2018 | Vazan et al. | |

* cited by examiner

Width of Shadow Region 402 Versus Gap Size and Lateral Distance, R

| g (μm) | Lateral Distance, R, from Center of Source 102 (mm) | | | | |
| --- | --- | --- | --- | --- | --- |
| | 0 | 10 | 20 | 30 | 40 |
| 1 | 0.0000 | 0.0143 | 0.0286 | 0.0429 | 0.0573 |
| 2 | 0.0000 | 0.0215 | 0.0429 | 0.0644 | 0.0859 |
| 3 | 0.0000 | 0.0286 | 0.0573 | 0.0859 | 0.1145 |
| 4 | 0.0000 | 0.0358 | 0.0716 | 0.1074 | 0.1432 |
| 5 | 0.0000 | 0.0429 | 0.0859 | 0.1288 | 0.1718 |

| g (μm) | Lateral Distance, R, from Center of Source 102 (mm) | | | | |
| --- | --- | --- | --- | --- | --- |
| | 50 | 60 | 70 | 80 | 90 |
| 1 | 0.0716 | 0.0859 | 0.1002 | 0.1145 | 0.1288 |
| 2 | 0.1074 | 0.1288 | 0.1503 | 0.1718 | 0.1933 |
| 3 | 0.1432 | 0.1718 | 0.2004 | 0.2291 | 0.2577 |
| 4 | 0.1790 | 0.2147 | 0.2505 | 0.2863 | 0.3221 |
| 5 | 0.2147 | 0.2577 | 0.3006 | 0.3436 | 0.3865 |

Table 2

FIG. 6B

Width of Feather Region 404 Versus Gap Size and Lateral Distance, R

| g (μm) | Lateral Distance, R, from Center of Source 102 (mm) | | | | |
| --- | --- | --- | --- | --- | --- |
| | 0 | 10 | 20 | 30 | 40 |
| 1 | 0.0000 | 0.0072 | 0.0143 | 0.0215 | 0.0286 |
| 2 | 0.0000 | 0.0143 | 0.0286 | 0.0430 | 0.0573 |
| 3 | 0.0000 | 0.0215 | 0.0430 | 0.0644 | 0.0859 |
| 4 | 0.0000 | 0.0286 | 0.0573 | 0.0859 | 0.1145 |
| 5 | 0.0000 | 0.0358 | 0.0716 | 0.1074 | 0.1432 |

| g (μm) | Lateral Distance, R, from Center of Source 102 (mm) | | | | |
| --- | --- | --- | --- | --- | --- |
| | 50 | 60 | 70 | 80 | 90 |
| 1 | 0.0358 | 0.0430 | 0.0501 | 0.0573 | 0.0644 |
| 2 | 0.0716 | 0.0859 | 0.1002 | 0.1145 | 0.1288 |
| 3 | 0.1074 | 0.1289 | 0.1503 | 0.1718 | 0.1933 |
| 4 | 0.1432 | 0.1718 | 0.2004 | 0.2291 | 0.2577 |
| 5 | 0.1790 | 0.2148 | 0.2505 | 0.2863 | 0.3221 |

Table 3

SYSTEM AND METHOD FOR DIRECT PATTERNING USING A COMPENSATED SHADOW MASK

CROSS REFERENCE TO RELATED APPLICATIONS

This application claims the benefit of U.S. Provisional Patent Application Ser. No. 63/404,076 filed Sep. 6, 2022, which is incorporated by reference as if set forth at length herein. If there are any contradictions or inconsistencies in language between this application and one or more of the cases that have been incorporated by reference that might affect the interpretation of the claims in this case, the claims in this case should be interpreted to be consistent with the language in this case.

TECHNICAL FIELD

The present disclosure relates to material deposition in general, and, more particularly, to direct patterning of a material layer on a substrate via deposition of the material onto the substrate through a shadow mask.

BACKGROUND

Semiconductor fabrication requires the formation of one or patterned layers of material on the surface of a substrate. The most common approach for forming a material pattern is to deposit a full-surface layer of the material over the entire surface of the substrate and then remove the material everywhere except where it is desired using an etchant. This is commonly referred to as "subtractive patterning."

Unfortunately, many materials cannot be patterned using subtractive patterning because they would be attacked by the chemicals required for the process. For such materials, therefore, a direct patterning process must be used in which the sensitive material is vaporized and its vapor is passed through openings (i.e., apertures) in a shadow mask to deposit on the substrate positioned behind the shadow mask, thereby forming the desired pattern in one step.

Historically, shadow-mask deposition has been used in semiconductor fabrication to define patterns of relatively large (>50 micron) features, such as wire-bond pads, etc., which do not require high precision or pattern fidelity. A typical shadow mask used in such applications includes a thin, patterned metal sheet held by an annular frame. While the minimum feature size and minimum separation between apertures for such shadow masks is quite large (typically greater than several tens of microns), such shadow masks are perfectly suitable for defining large-feature-size, sparse patterns of material like wire-bond pad patterns.

More recently, shadow-mask deposition has become ubiquitous in the formation of active-matrix displays based on organic light-emitting diodes (OLED). However, as such displays have evolved to every higher resolution, a need to form patterns of organic materials having at least one dimension of only a few microns has arisen. For example, the resolution of micro displays increases rapidly with more advanced methods becoming available to pattern OLED subpixels of less than 3.5 micron in the shortest dimension. In the near future, subpixel dimensions of 2 micron or even less are anticipated. Recent success in direct patterning of OLED micro displays with red, green, and blue subpixels formed side by side can be credited to the development of the advanced high-resolution shadow mask as thin as one micron and with the openings on the scale of a few microns.

Theoretically, during shadow-mask deposition, material deposits only on the surface of the substrate in those regions located directly behind the apertures. In practice, however, the vaporized material travels from the source to the shadow mask as a non-collimated plume. As a result, much of the vapor propagates along directions that are not perfectly normal to the shadow mask and substrate.

Furthermore, the substrate is typically separated from the shadow mask by a small gap to prevent damage to one or both of the shadow mask and substrate, as well as enable their active alignment.

The non-collimated vapor plume, combined with the separation between the shadow mask and substrate give rise to at least two undesirable effects. The first, referred to as "shadowing," occurs when the evaporated material arrives at an angle at the substrate and deposits on a smaller area than the desired outline of the sub-pixel. The second, referred to as "feathering," occurs when vaporized material passes through the shadow mask at an angle and continues to travel laterally beyond the edges of the aperture through which it passes. The magnitude of this feathering is a function of the separation distance between the substrate surface and the shadow mask, which is preferably very small—a few microns at most, as well as the orientation of the source relative to the center of the shadow mask.

While shadowing and feathering are not critical issues when forming large, widely spaced features (e.g., wire-bond pads, etc.), they can be highly problematic when forming small-feature, highly dense patterns. In fact, feathering has been a limiting factor for the minimum feature size and pattern density attainable using shadow-mask deposition.

The ability to form high-resolution patterns of small, closely spaced features with high pattern fidelity using shadow-mask deposition would be a welcome advance in the state of the art.

SUMMARY

The present disclosure is directed toward apparatus and methods that enable direct patterning of a material layer on a substrate via shadow-mask deposition with reduced shadowing and feathering relative to what can be realized in the prior art by employing a shadow mask whose aperture pattern is compensated based on the geometry of the deposition system in which it is used. Embodiments in accordance with the present disclosure are particularly well suited for use in fabricating organic light-emitting diodes (OLEDs), OLED displays, organic solar cells, and the like.

An advance over the prior art is realized by compensating the pattern of apertures of a shadow mask to accommodate the range of propagation angles in a vapor plume used to deposit material onto the substrate through the shadow mask. In contrast to the prior art, wherein aperture positions in a shadow mask are perfectly aligned with the locations at which material deposition is desired, embodiments in accordance with the present disclosure include a shadow mask in which aperture position is shifted in at least one lateral direction based on the distance an aperture from the center of the shadow mask and, in some cases, based further upon a lateral offset between the center of the shadow mask and the center of the evaporation source. Without any such lateral offset, the position of each aperture is shifted inward toward the center of the shadow mask by an amount based on the distance of that aperture from the center of the shadow mask. Such aperture shifts enable vaporized material that passes through each aperture at a non-normal angle to deposit onto the substrate at its proper location.

An illustrative embodiment includes a source of vaporized material, a shadow mask, and a substrate chuck for holding a target substrate. The target substrate, shadow mask, and source are centered on a central axis. The source provides a vapor plume that expands laterally as it progresses toward the target substrate such that the vaporized material propagates toward the substrate along a wide range of angles. The shadow mask has a two-dimensional pattern of apertures for forming a two-dimensional pattern of subpixels on the target substrate, wherein some or all of the apertures are shifted laterally in at least one dimension relative to the desired locations of their corresponding subpixels on the substrate. The lateral shift of each aperture relative to its corresponding desired subpixel location is based on the position of the aperture, the separation between the shadow mask and the substrate, and the throw distance between the source and the substrate.

An embodiment in accordance with the present disclosure is a system for directly depositing a material on a substrate, the system comprising: a source for providing vaporized material; and a shadow mask having a plurality of apertures arranged in a first pattern having a center point, wherein adjacent apertures along a first dimension are spaced apart by a distance that monotonically decreases with distance from the center point along the first dimension; wherein the shadow mask is configured for placement between the source and the substrate.

Another embodiment in accordance with the present disclosure is a method for depositing material on a substrate, the method comprising: vaporizing a first material; and passing the vaporized first material through a shadow mask onto the substrate, wherein the shadow mask has a plurality of apertures arranged in a first pattern that has a center point, and wherein adjacent apertures along a first dimension are spaced apart by a distance that monotonically decreases with distance from the center point along the first dimension.

BRIEF DESCRIPTION OF THE DRAWINGS

FIG. 1 depicts a schematic drawing of an illustrative embodiment of a shadow-mask deposition system in accordance with the prior art.

FIG. 3 depicts a schematic drawing of a typical relationship between a shadow mask and a wafer in accordance with the prior art.

FIGS. 6A-B depict tables showing the width (in the x-direction) of shadow region 402 and feather region 404 for a desired subpixel location 202($i$) as a function of gap size, g, and lateral distance, R, from the center of source 102.

DETAILED DESCRIPTION

Figure 1:
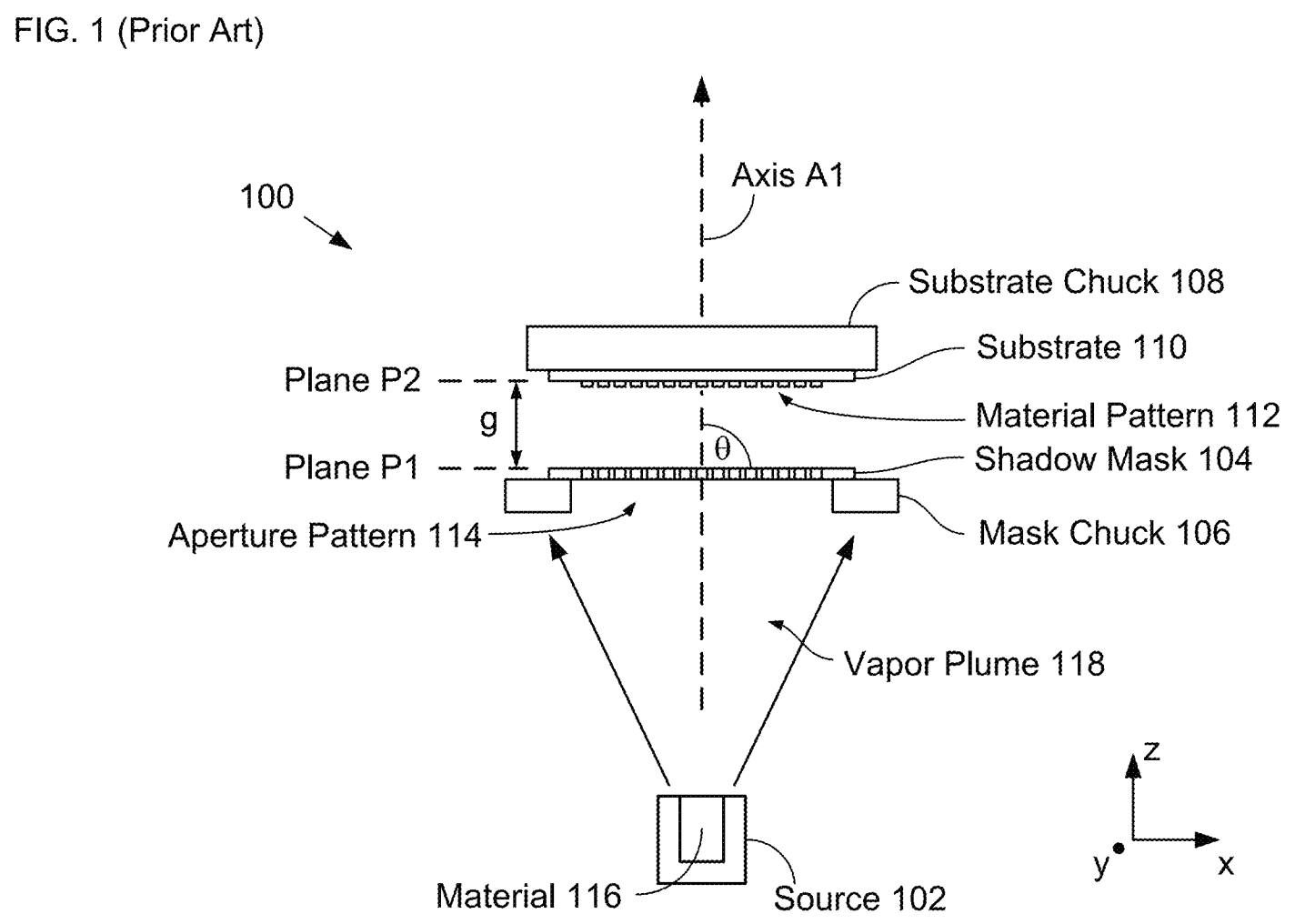
Figures 2A, 2B:
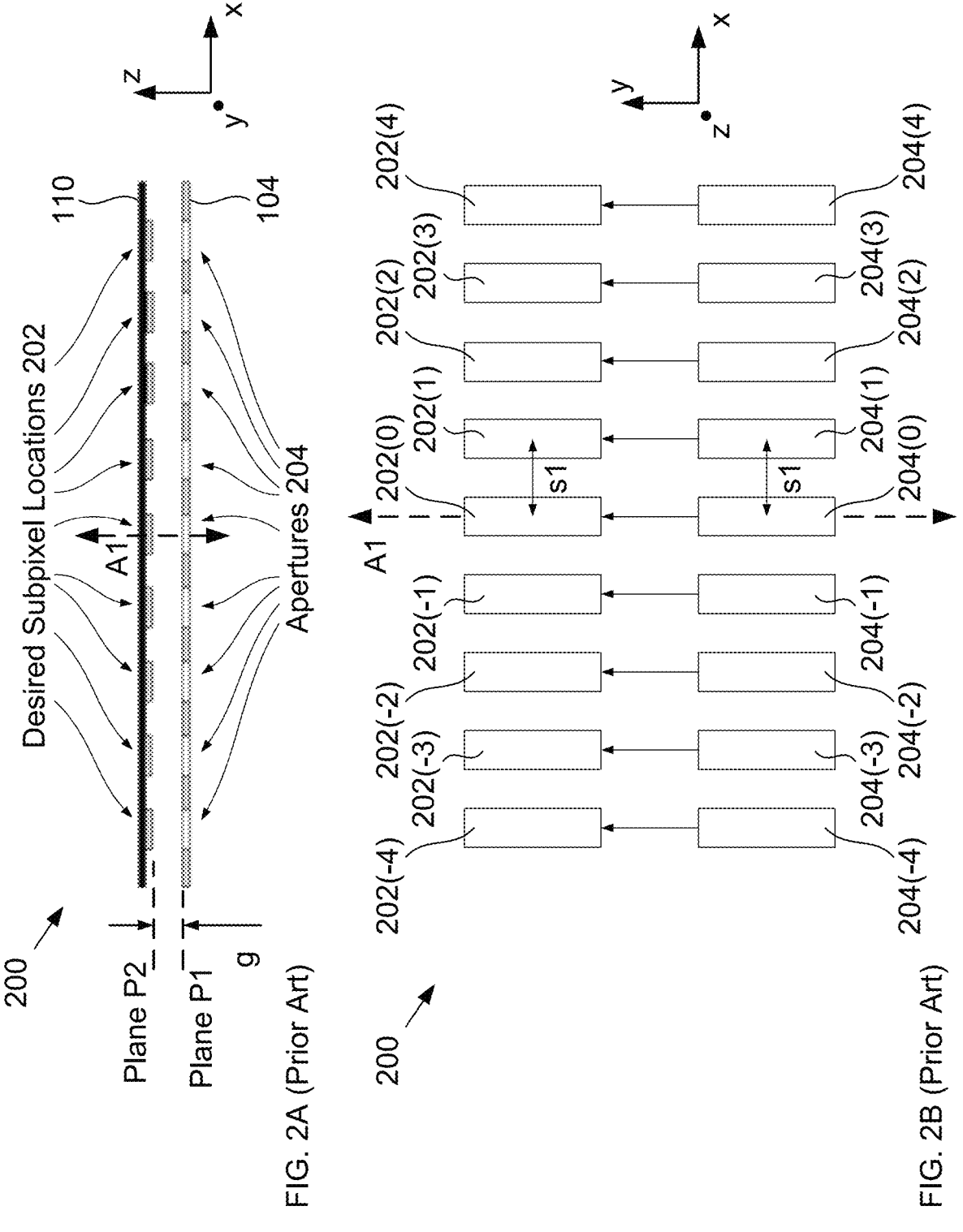
FIGS. 2A-B depict schematic drawings of an idealized relationship between a shadow mask and a wafer in accordance with the prior art.

FIG. 1 depicts a schematic drawing of an illustrative embodiment of a shadow-mask deposition system in accordance with the prior art. System 100 includes source 102, shadow mask 104, mask chuck 106, and substrate chuck 108. System 100 is a conventional vertical direct-deposition system for forming material pattern 112 on substrate 110.

Typically, the components of a vertical direct-deposition system are enclosed in a conventional pressure vessel that provides a low-pressure atmosphere that supports direct deposition of material pattern 112.

Source 102 is crucible for vaporizing material 116 to create vapor plume 118. In the depicted example, material 116 is an organic material suitable for use in an OLED and source 102 acts substantially as a point source for the vaporized material because the open area of its crucible is significantly smaller than the area of substrate 110.

Shadow mask 104 is an element that includes a layer of structural material having a plurality of apertures arranged in aperture pattern 114, where the size and arrangement of the apertures are based on the desired deposition pattern for material 116. The surface of shadow mask 104 proximal to substrate 118 defines plane P1.

Mask chuck 106 is a mechanical clamp that locates shadow mask 104 between source 102 and substrate 110.

Substrate chuck 108 is a platen for securing substrate 110 such that the substrate is as flat as possible.

Substrate 110 is a glass substrate suitable for supporting the planar-processing-based fabrication of an OLED display. In some embodiment, substrate 118 is a different conventional substrate, such as a semiconductor wafer (e.g., silicon, gallium arsenide, indium phosphide, etc.), composite substrate, etc., that is suitable for planar processing. The surface of substrate 110 that is proximal to shadow mask 104 defines plane P2.

In operation, source 102, shadow mask 104 and substrate 110 are aligned such that they are substantially concentric along vertical axis A1, the shadow mask and substrate are parallel and separated by gap, g, (typically a few tens or hundreds of microns) along the vertical axis, and the apertures of the shadow mask are aligned with their respective desired deposition sites on substrate 110. In the depicted example, each of planes P1 and P2 is substantially orthogonal with vertical axis A1 (i.e., $\theta=90°$).

When heated, source 102 melts material 116 to generate vapor plume 118. As discussed above, vapor plume 118 includes material vapor that propagates along directions that span a relatively large angular range. As a result, vaporized atoms travel some lateral distance after passing through the apertures of the shadow mask, leading to feathering and shadowing of material 116 at the desired subpixel locations in material pattern 112.

The amount of feathering and shadowing that occurs is determined by the lateral and rotation alignments between planes P1 and P2, the size of gap, g, between them, and the range of propagation angles in vapor plume 118.

FIGS. 2A-B depict schematic drawings of an idealized relationship between a shadow mask and a wafer in accordance with the prior art.

In arrangement 200, desired subpixel locations 202 are linearly arranged along the x-axis such that: subpixel location 202(0) is located in the center of substrate 110 such that the subpixel location is centered on axis A1; subpixel locations 202(1) through 202(4) are equally spaced to the right of subpixel location 202(0) such that adjacent subpixels have center-to-center spacing s1, and subpixel locations 202(-1) through 202(-4) are equally spaced to the left of subpixel location 202(0) such that adjacent subpixels have center-to-center spacing s1.

In the prior art, each of apertures 204 of shadow mask 104 is aligned with its corresponding desired pixel location 202. As a result, apertures 204 are also linearly arranged along the x-axis such that: aperture 204(0) is located in the center of aperture pattern 114 such that it is centered on axis A1; apertures 204(1) through 204(4) are equally spaced to the right of aperture 204(0) such that adjacent apertures are separated by spacing s, and apertures 204(-1) through 204(-4) are equally spaced to the left of aperture 204(0) such that adjacent apertures are separated by spacing s.

Figure 3:
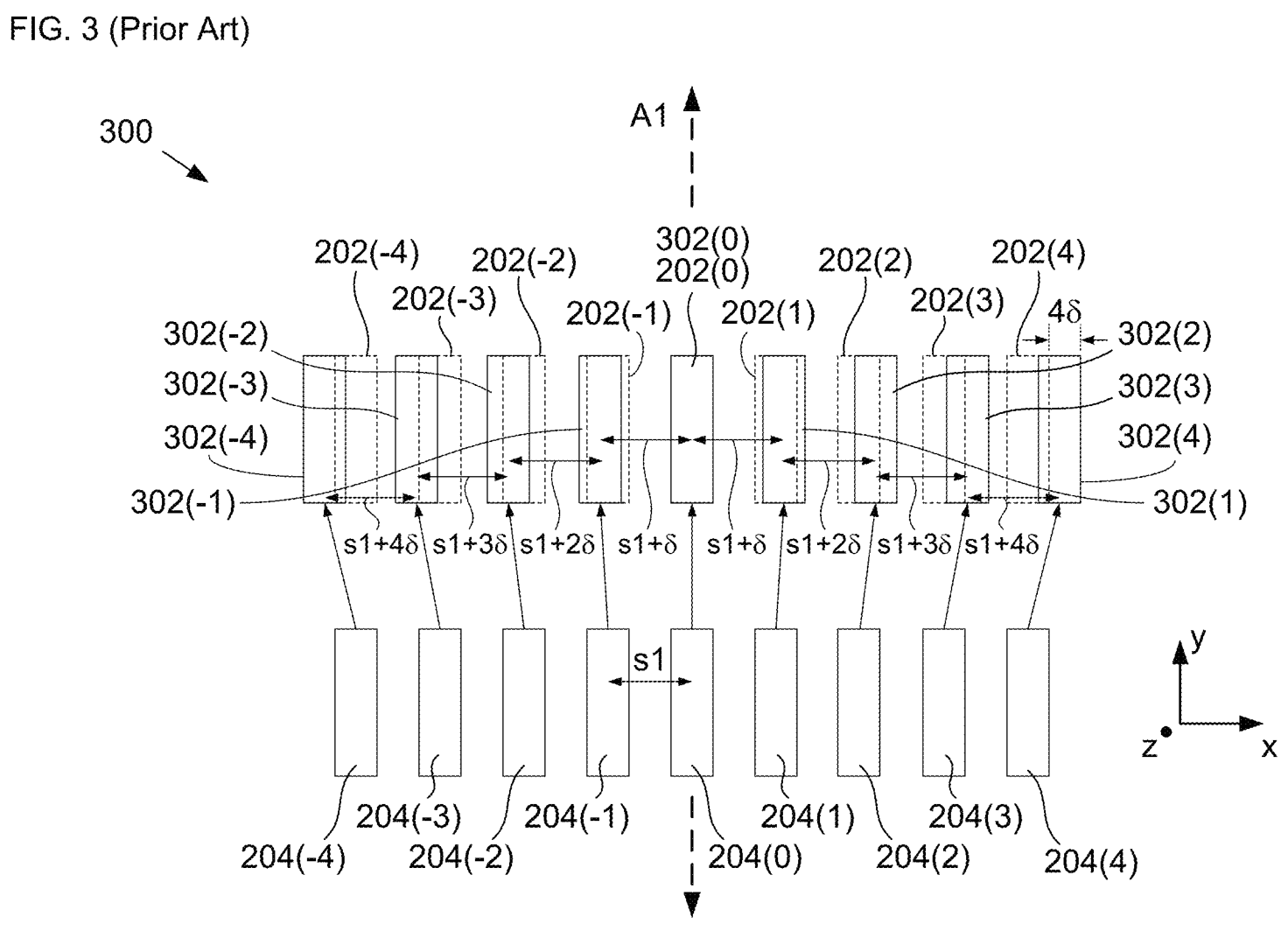

FIG. 3 depicts a schematic drawing of a typical relationship between a shadow mask and a deposited material pattern on a wafer in accordance with the prior art.

In contrast to what is depicted in FIGS. 2A-B, in practice, the size of gap, g, coupled with the range of angles for the propagation directions of the vaporized material in vapor plume 118 give rise to a monotonic increase in the separation between the deposited regions 302 of material 116 as the position of each deposited region increases from the center of substrate 110.

As a result, each deposited region 302 is offset from its respective desired subpixel locations 202 by an amount that steadily increases with the distance of that subpixel from axis A1.

For example, for a given value of g and a given range of angles in the propagation directions of vaporized material 116, a monotonic increase of δ arises in the center-to-center spacing between each pair of adjacent deposited regions 302 as the position of these deposited regions moves outward along the x-direction. As a result, although central deposited region 302(0) is perfectly aligned with central desired subpixel location 202(0) along the x-direction, moving outward along the x-direction from central axis A1, each successive deposited region 302 is shifted outward by δ from its preceding deposited region. As a result, for example, deposited region 302(1) is shifted outward from subpixel location 202(1) by δ, deposited region 302(2) is shifted outward from subpixel location 202(2) by 2δ, and so on.

Figure 4:
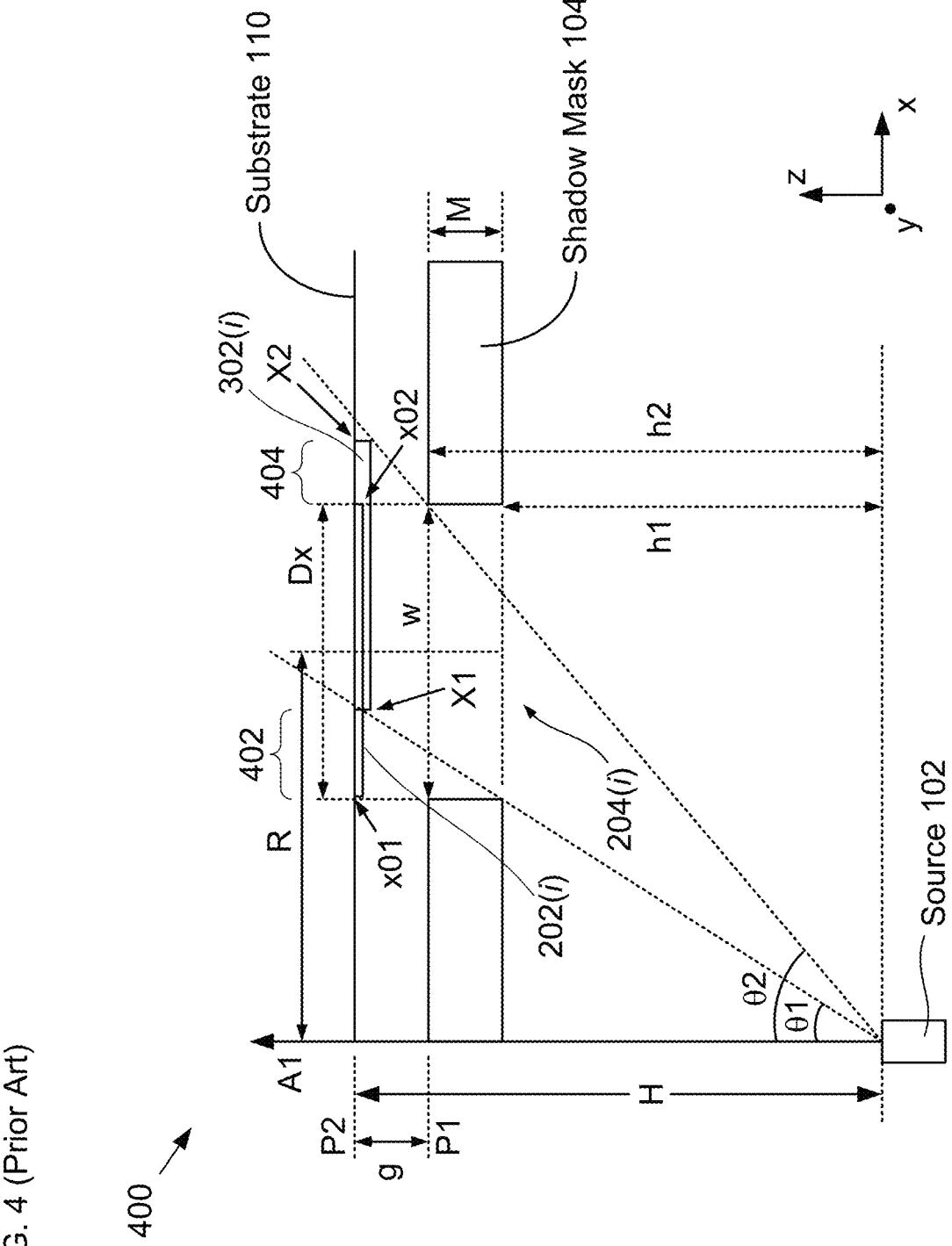
FIG. 4 depicts a schematic drawing of the basic geometry of a direct-deposition system in accordance with the prior art.

FIG. 4 depicts a schematic drawing of the basic geometry of a direct-deposition system in accordance with the prior art. In arrangement 400, aperture 204(i) is perfectly aligned with desired subpixel location 202(i). The centers of the aperture and subpixel location are located at distance R from axis A1, which is aligned with the center of source 102.

The top surface of shadow mask 104 defines plane P3 and the bottom surface of substrate 110 defines plane P4. Planes P1 and P2 are parallel and separated by distance g. Furthermore, shadow mask 104 has a thickness of M and the bottom surface of substrate 110 (i.e., plane P2) is at a throw distance, H, from source 102.

Subpixel location 202(i) corresponds to a subpixel having width Dx, which is the distance between points x01 and x02. This width is equal to the width, w, of aperture 204(i).

During evaporation of material 116, the vaporized material arrives at substrate 110 at the range of angles from θ1 to θ2 after passing through aperture 204(i). Due to the gap, g, the evaporated material fails to reach substrate 110 in the region between locations x01 and X1, thereby defining shadow region 402.

In addition, material 116 is deposited in the area between points x02 and X2, which is a region that lies beyond the desired subpixel location, thereby defining feather region 404. It should be noted that incident angles θ1 and θ2 depend on the size of gap g, mask thickness M, and throw distance H. The salient parameters of arrangement 400 can be described by the following equations:

$$Dx = x02 - x01 \tag{1}$$

$$x01 = R - s/2 \tag{2}$$

$$X02 = r + s/2 \tag{3}$$

$$h1 = H - G - M \tag{4}$$

$$h2 = H - G \tag{5}$$

$$\tan\theta1 = x01/h1 \tag{6}$$

$$\tan\theta2 = x02/h2. \tag{7}$$

Using equations (1) through (7), the size of shadow region 402 and feather region 404 can be determined for different separation distances, g, between substrate 110 and shadow mask 104. Table 1 below lists the width (in the x-direction) of shadow region 402 and feather region 404 for a desired subpixel location 202(i) for R=90 mm.

TABLE 1

| Widths of shadow region 402 and feather region 404 for various values of gap, g. | | |
|---|---|---|
| g (μm) | Shadow (μm) | Feathering (μm) |
| 0 | 0.064 | 0.000 |
| 1 | 0.129 | 0.064 |
| 2 | 0.193 | 0.129 |
| 3 | 0.258 | 0.193 |
| 4 | 0.322 | 0.258 |
| 5 | 0.387 | 0.322 |

Figures 5A, 5B:
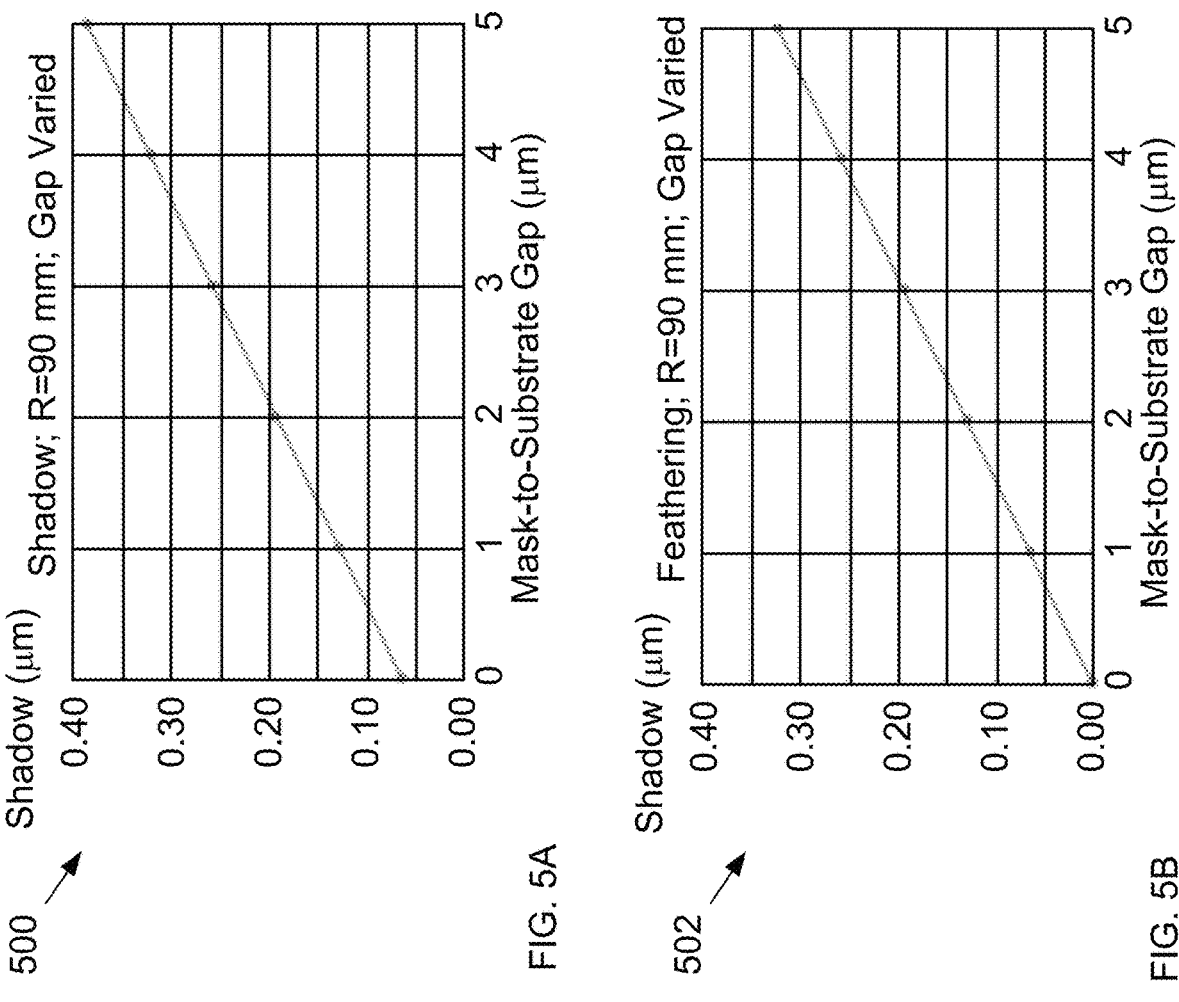
FIGS. 5A-B depict plots of the relationships between the width of shadow region 402 and feather region 404, respectively, and the size of gap g.

FIGS. 5A-B depict plots of the relationships between the width of shadow region 402 and feather region 404, respectively, and the size of gap g.

FIGS. 6A-B depict tables showing the width (in the x-direction) of shadow region 402 and feather region 404 for a desired subpixel location 202(i) as a function of gap size, g, and lateral distance, R, from the center of source 102. Table 2 shows the effect of gap size, g, and distance, R, on the width of shadow region 402. Table 3 shows the effect of gap size, g, and distance, R, on the width of feature region 404.

It should be noted that shadow and feather regions of such sizes could potentially be tolerated for the large-format display, which have subpixel dimensions of about hundred microns; however, high-resolution microdisplays have subpixel dimensions of only few microns and, therefore, cannot tolerate such lack of pattern fidelity. For microdisplays, such shadowing and feathering effects would lead to sub-pixels that are not fully covered by the deposited material and/or cross-contamination of sub-pixels, leading to a loss in luminance and/or poor color rendering.

It is an aspect of the present disclosure, however, that better pattern fidelity can be realized by compensating the arrangement of apertures of a shadow mask such that the positions of the apertures are offset from their respective desired subpixel locations by a distance based on their distance from the center of the target substrate. In other words, in accordance with the teachings herein, shadowing and feathering in the presence of the mask-to-wafer gap of few microns can by mitigated by laterally shifting the shadow mask features based on the geometry of the deposition system.

Figure 7:
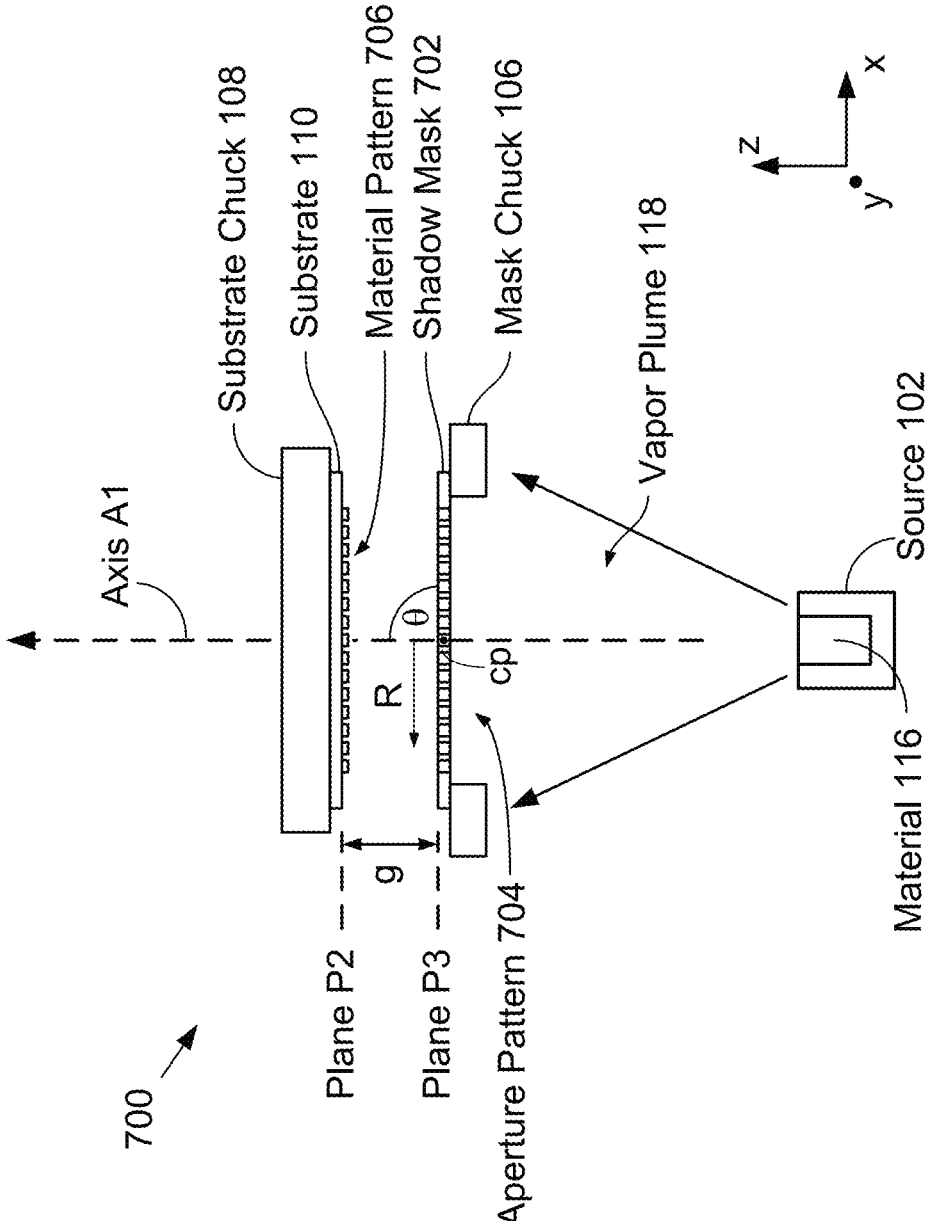
FIG. 7 depicts a schematic drawing of an illustrative embodiment of a shadow-mask deposition system in accordance with the present disclosure.

FIG. 7 depicts a schematic drawing of an illustrative embodiment of a shadow-mask deposition system in accordance with the present disclosure. System 700 includes source 102, shadow mask 702, mask chuck 106, and substrate chuck 108. System 700 is a vertical direct-deposition system for forming material pattern 706 on substrate 110.

Shadow mask 702 is analogous to shadow mask 104 described above; however, shadow mask 702 includes compensated aperture pattern 704.

In compensated aperture pattern 704, the arrangement of apertures is compensated to account for the range of propagation angles in vapor plume 118. As a result, every aperture is not perfectly aligned with the desired deposition location with which it corresponds.

Figure 8:
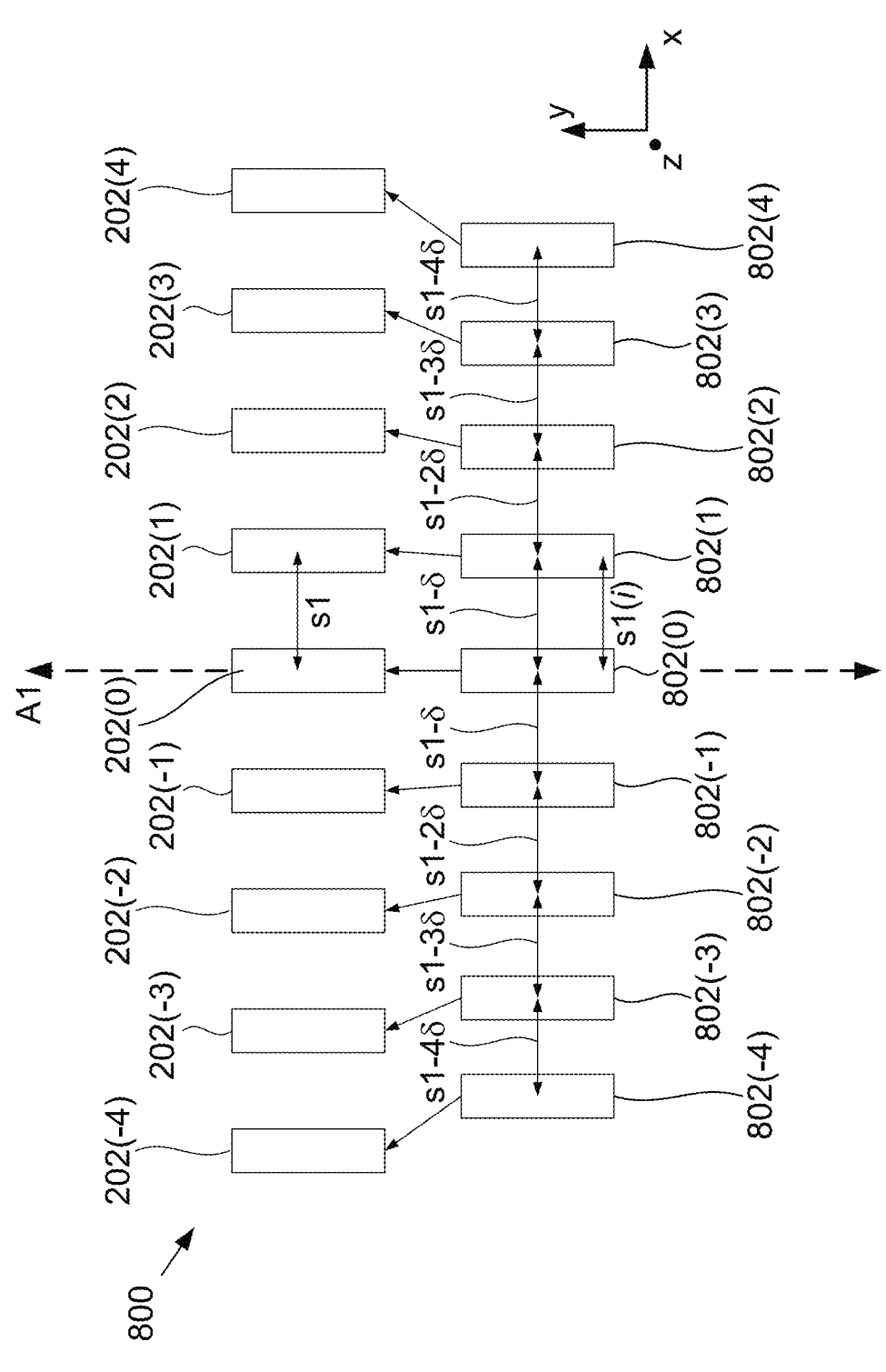
FIG. 8 depicts a schematic drawing of a relationship between the apertures of a shadow mask and their corresponding subpixel locations on a wafer in accordance with the present disclosure.

FIG. 8 depicts a schematic drawing of a relationship between the apertures of a shadow mask and their corresponding subpixel locations on a wafer in accordance with the present disclosure.

In arrangement 800, apertures 802 are laterally shifted along the x-axis relative to their corresponding subpixel locations such that: aperture 802(0) is perfectly aligned with subpixel location 202(0), which is located in the center of substrate 110 and centered on axis A1; apertures 802(1) and 802(-1) are shifted slightly toward axis A1 relative to subpixel locations 202(1) and 202(-1), respectively; apertures 802(2) and 802(-2) are shifted slightly more toward axis A1 relative to subpixel locations 202(2) and 202(-2), respectively; apertures 802(3) and 802(-3) are shifted even more toward axis A1 relative to subpixel locations 202(3) and 202(-3), respectively; and apertures 802(4) and 802(-4) are shifted the most toward axis A1 relative to subpixel locations 202(4) and 202(-4), respectively. The amount of lateral shift applied to each aperture is based on its position relative to the center of aperture pattern 704, the size of gap, g, and the throw distance, H, as discussed below and with respect to FIG. 9.

For illustration purposes, an exemplary shadow mask in accordance with the present disclosure is described here with respect to a substrate having subpixel locations on a fixed center-to-center spacing, s, and the same given value of g and range of angles in the propagation directions of vaporized material 116 as discussed above and with respect to FIGS. 2 and 3. Using these parameters, deposition of material 116 on subpixels 202 with high pattern fidelity and minimal feathering is enabled by employing shadow mask 702 having a center-to-center spacing, s, between adjacent apertures 802 that decreases by δ along the x-direction away from central axis A1. For example, along the x-direction, when shadow mask 702 is aligned with substrate 110, aperture 802(0) is aligned with central subpixel location 202(0) and the center-to-center spacing between adjacent apertures decreases by δ for each successive pair of adjacent apertures. As a result, along the positive x-direction, aperture 802(0) and aperture 802(1) have a center-to-center spacing of s-δ, apertures 802(2) and 802(1) have a centerto-center spacing of s-2δ, apertures 802(3) and 802(2) have a center-to-center spacing of s-3δ, and so on.

It should be noted that, although the depicted example includes a uniform indexed shift of aperture locations, myriad lateral shifts (e.g., non-uniform, non-linearly varying, varying according to a mathematical function ƒ(x), etc.) are within the scope of the present disclosure. Furthermore, in some embodiments, subpixel or pixel sites are not on uniform center-to-center spacing; therefore, the required compensation shift is adjusted accordingly. Still further, in some embodiments, source 102, shadow mask 702, and substrate 110 are not concentric during deposition. In such embodiments, the compensation applied to apertures 802 include an additional factor to account for this lack of concentricity.

Figure 9:
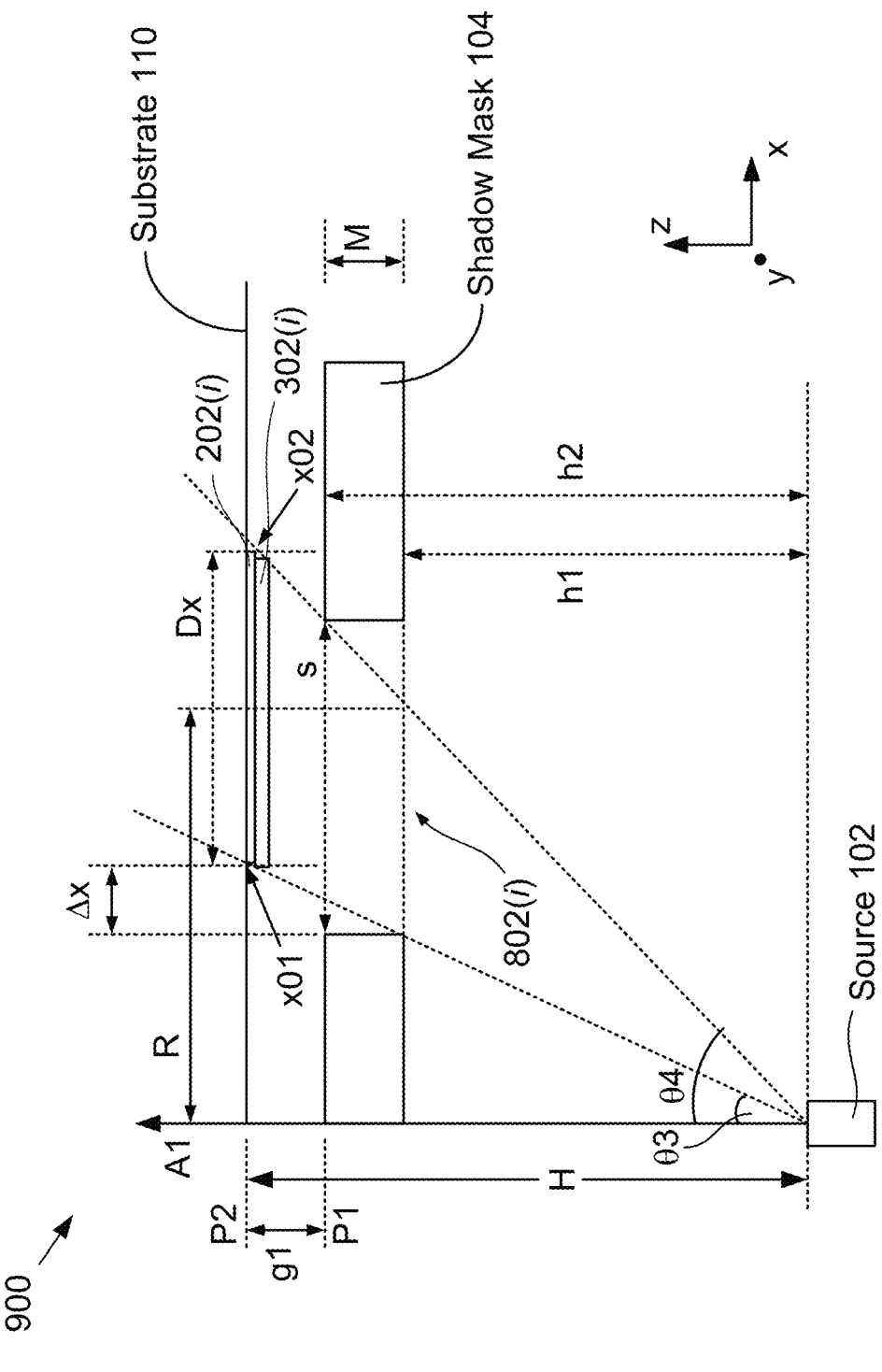
FIG. 9 depicts a schematic drawing of the basic geometry of a direct-deposition system in accordance with the present disclosure.

FIG. 9 depicts a schematic drawing of the basic geometry of a direct-deposition system in accordance with the present disclosure. In arrangement 900, aperture 802(i) is shifted laterally with respect to its corresponding desired subpixel location 202(i) by δx, which is determined from the position of that subpixel relative to the center of substrate 110, as well as gap g1 and throw distance H. The value of ox for each aperture can be determined using equations (1) through (7).

Using a compensated shadow mask accordance with the present disclosure, evaporated material 116 is deposited on the entire desired subpixel location (i.e., between points, x01 and x02).

As the location of a desired subpixel moves away from the center of substrate 110 (i.e., axis A1), angles θ3 and θ4 increase gradually from zero to a few degrees. As a result, δx must also increase gradually to mitigate shadowing and feathering, thereby attaining substantially complete material coverage of the desired subpixel location.

The specific value of δx for a given subpixel location is calculated based on the incident angle θ3, which, in turn, depends on the location of the subpixel from the substrate center (i.e., distance R), throw distance H, and the mask-to-wafer gap g1. It should be noted that the mask-to-wafer gap must typically be predetermined and maintained constant during deposition for a given shadow mask having gradually shifted openings (which are also typically designed in advance).

Up to this point, for ease of explanation, the discussion of a compensated shadow mask has been in the context of a one-dimensional lateral shift (i.e., along the x-direction). As will be apparent to one skilled in the art, however, a typical OLED fabrication process is based on a shadow mask having a two-dimensional array of apertures.

Figure 10:
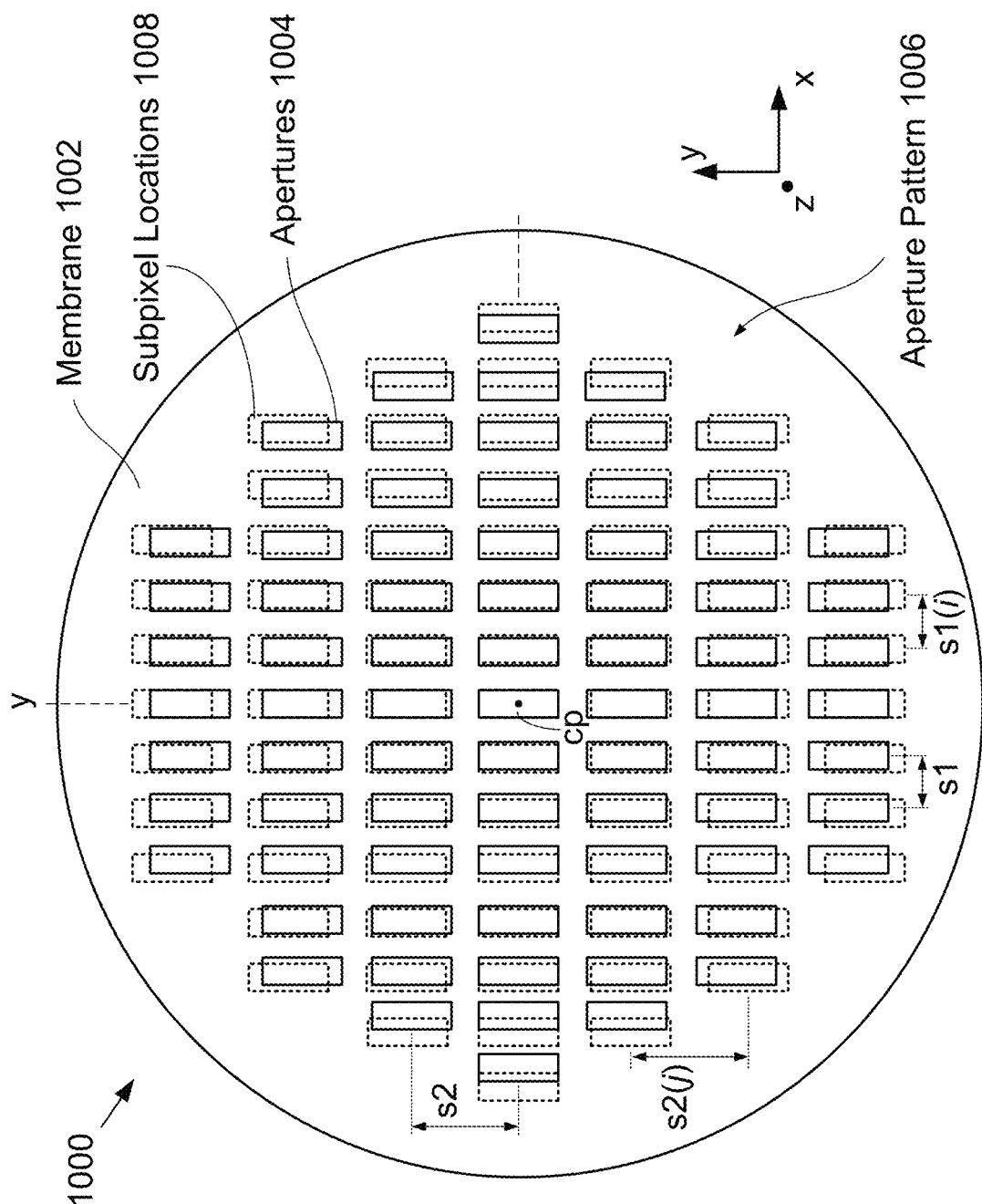
FIG. 10 depicts a schematic drawing of a top view of a shadow mask having a two-dimensional arrangement of apertures that are compensated in two-dimensions in accordance with the present disclosure.

FIG. 10 depicts a schematic drawing of a top view of a shadow mask having a two-dimensional arrangement of apertures that are compensated in two-dimensions in accordance with the present disclosure. Mask 1000 is analogous to mask 702; however, mask 1000 includes membrane 1002 and apertures 1004, which are arranged in two-dimensional pattern 1006 configured to deposit material 116 on a two-dimensional pattern of subpixel locations 202 having uniform center-to-center spacings s1 along the x-direction and s2 along the y-direction. Aperture pattern 1006 includes an arrangement of apertures 1004(i,j) that is symmetric about center point cp, where through i=−m and j=−n through +n.

For clarity, apertures 1004 are depicted relative to their corresponding subpixel locations 1008. As can be seen from FIG. 10, the apertures are shifted inward (i.e., toward the center of the mask) by increasing amounts, relative to their corresponding subpixel locations, according to their distance from center point cp in both the x- and y-dimensions to provide compensation as discussed above. Along the x-direction, the center-to-center spacing between adjacent apertures $1004(i,j)$ and $1004(i+i,j)$ is designated as $s1(i)$. In similar fashion, along the y-direction, the center-to-center spacing between adjacent apertures $1004(i,j)$ and $1004(i,j+1)$ is designated as $s2(j)$.

It should be noted that it would be difficult, if not impossible, to properly depict actual shifts for a typical microdisplay. For example, the WUXGA format microdisplay has resolution of 1200×1920 pixels with the density of pixels 2645 PPI (pixels-per-inch). Each subpixel has the shortest dimension of 2.45 microns. There will be more than 2 million subpixels for each microdisplay, and the number of such WUXGA microdisplays on, for example, the 200 mm diameter wafer is close to 70. Rigorous computations must be carried out to calculate the necessary shift for each aperture relative to its corresponding pixel location at the fixed mask-to-wafer gap value.

It is to be understood that the disclosure teaches just some embodiments in accordance with the present disclosure and that many variations can easily be devised by those skilled in the art after reading this disclosure and that the scope of the invention is determined by the following claims.

What is claimed is:

1. A system for directly depositing a material on a substrate that includes a plurality of subpixel locations arranged along a first dimension and a second dimension, the system comprising:

a source for providing vaporized material;

a shadow mask having a plurality of apertures that is arranged in a two-dimensional pattern, the plurality of apertures having a one-to-one correspondence with the plurality of subpixel locations, wherein each pair of adjacent apertures of the plurality thereof have a first spacing that is based on the location of the pair of adjacent apertures along the first dimension, and wherein each pair of adjacent apertures of the plurality thereof have a second spacing that is based on the location of the pair of adjacent apertures along the second dimension; and a substrate chuck for holding the substrate;

wherein the shadow mask is located between the source and the substrate when the substrate is held in the substrate chuck.

2. The system of claim 1 wherein the plurality of subpixel locations has a center point and a uniform center-to-center spacing along the first dimension, and wherein the plurality of apertures is concentric with the plurality of subpixel locations when the shadow mask and substrate are aligned, and further wherein the first spacing depends on the location of each pair of adjacent apertures of the plurality thereof with respect to the center point.

3. The system of claim 2 wherein the second spacing further depends on a magnitude of a gap between the shadow mask and the substrate and a magnitude of a throw distance between the source and the substrate.

4. The system of claim 2 wherein the first spacing monotonically decreases with distance from the center point along the first dimension.

5. The system of claim 1 wherein the plurality of subpixel locations has a center point, a uniform center-to-center spacing along the first dimension, and a uniform center-to-center spacing along the second dimension, and wherein the plurality of apertures is concentric with the plurality of subpixel locations when the shadow mask and substrate are aligned, and further wherein the first spacing depends on the location of each pair of adjacent apertures of the plurality thereof along the first dimension with respect to the center point and the second spacing depends on the location of each pair of adjacent apertures of the plurality thereof along the second dimension with respect to the center point.

6. The system of claim 5 wherein the first spacing monotonically decreases with distance from the center point along the first dimension and the second spacing monotonically decreases with distance from the center point along the second dimension.

7. A method for directly depositing a first material on a substrate that includes a plurality of subpixel locations arranged along a first dimension and a second dimension, the method comprising:

locating a shadow mask between a source for vaporizing the first material and the substrate, wherein the shadow mask includes a plurality of apertures that is arranged in a two-dimensional pattern, the plurality of apertures having a one-to-one correspondence with the plurality of subpixel locations, wherein each pair of adjacent apertures of the plurality thereof have a first spacing that is based on the location of the pair of adjacent apertures along the first dimension and a second spacing a second spacing that is based on the location of the pair of adjacent apertures along the second dimension;

vaporizing the first material; and passing the vaporized first material through a shadow mask onto the plurality of subpixel locations.

8. The method of claim 7 further comprising providing the shadow mask such that the plurality of subpixel locations has a center point and a uniform center-to-center spacing along the first dimension, and wherein the plurality of apertures is concentric with the plurality of subpixel locations when the shadow mask and substrate are aligned, and further wherein the first spacing depends on the location of each pair of adjacent apertures of the plurality thereof with respect to the center point.

9. The method of claim 8 wherein the shadow mask is provided such that the second spacing further depends on a magnitude of a gap between the shadow mask and the substrate and a magnitude of a throw distance between the source and the substrate.

10. The method of claim 8 wherein the shadow mask is provided such that the first spacing monotonically decreases with distance from the center point along the first dimension.

11. The method of claim 7 wherein the shadow mask is provided such that the plurality of subpixel locations has a center point, a uniform center-to-center spacing along the first dimension, and a uniform center-to-center spacing along the second dimension, and wherein the plurality of apertures is concentric with the plurality of subpixel locations when the shadow mask and substrate are aligned, and further wherein the first spacing depends on the location of each pair of adjacent apertures of the plurality thereof along the first dimension with respect to the center point and the second spacing depends on the location of each pair of adjacent apertures of the plurality thereof along the second dimension with respect to the center point.

12. The method of claim 11 wherein the shadow mask is provided such that the first spacing monotonically decreases with distance from the center point along the first dimension and the second spacing monotonically decreases with distance from the center point along the second dimension.

* * * * *